(12) United States Patent
Lin

(10) Patent No.: US 6,598,218 B2
(45) Date of Patent: Jul. 22, 2003

(54) OPTICAL PROXIMITY CORRECTION METHOD

(75) Inventor: Chin-Lung Lin, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 156 days.

(21) Appl. No.: 09/741,622

(22) Filed: Dec. 19, 2000

(65) Prior Publication Data

US 2002/0078428 A1 Jun. 20, 2002

(51) Int. Cl.[7] ............................................. G06F 17/50
(52) U.S. Cl. ............................................. 716/21; 716/19
(58) Field of Search ................ 716/1–21; 382/144; 430/5; 703/5, 13

(56) References Cited

U.S. PATENT DOCUMENTS 6,269,472 B1 * 7/2001 Garza et al. .................. 716/21
6,370,679 B1 * 4/2002 Chang et al. ................. 716/19

* cited by examiner

Primary Examiner—Matthew Smith
Assistant Examiner—Helen Rossoshek
(74) Attorney, Agent, or Firm—Charles C. H. Wu; Wu & Cheung, LLP

(57) ABSTRACT

An optical proximity correction method that uses additional corner serifs or hammerhead pattern to correct and avoid pull up of ends in a main pattern. These corner serifs are set such that the main pattern is corrected with only a slight line-end width expansion and line-end approaching the original design in length. Since the optical proximity correction method is able to correct the main pattern so that the end approaches the original design after a photo-exposure, any misalignment that may lead to uncompleted contact or an open of metallic interconnects can be avoided. Furthermore, the slightly expanded end permits a higher process window in the fabrication of metallic interconnects.

12 Claims, 3 Drawing Sheets

OPTICAL PROXIMITY CORRECTION METHOD

BACKGROUND OF THE INVENTION

1. Field of Invention

The present invention relates to an optical proximity correction method. More particularly, the present invention relates to an optical proximity correction method of fabricating photomasks for metallic interconnects.

2. Description of Related Art

Due to the rapid development of integrated circuit techniques, device miniaturization and integration is a common trend. In the process of fabricating an integrated circuit, photolithographic and etching processes have major influences on the ultimate operating characteristics of the fabricated devices. As the level of integration continues to increase, device dimensions as well as distance of separation between neighboring devices are reduced correspondingly. Consequently, a pattern transferred to a silicon chip using a photolithographic process may result in some deviation. For example, sharp corners in the pattern may be rounded, line-ends of a line pattern may be pulled up and line width may be reduced or increased. All these occurrences are often referred to as optical proximity effects (OPE).

The aforementioned deviations have little negative effect on the integrated circuit if dimensions of devices are relatively large or the level of integration is low. However, the negative effects on a highly integrated circuit can be serious. This is because the distance between neighboring devices in a highly integrated circuit is very small. If there is a deviated expansion in the line-width when a pattern is transferred to a silicon chip, partial pattern overlap may occur, leading to an open. In other words, any reduction of device dimensions for increasing operating speed is likely to be limited by pattern transfer fidelity in photolithographic process.

There are several possible factors leading to optical proximity effects. The main factors include optical interference during the passage of light through the pattern on a photomask, baking temperature/time during photoresist preparation, photoresist development, light reflected from an uneven substrate and the effects of etching. As dimension tolerances are reduced due to a higher level of integration, pattern transfer deviation due to optical proximity effects is likely to increase.

To prevent variation of critical dimensions in mask pattern transfer, an optical proximity correction procedure is often applied during photomask fabrication. That is, a pattern to be transferred to the semiconductor substrate of a silicon chip is first processed by computer software to obtain data for optical proximity correction of the mask pattern. The data is then filed in a computer. A patterned photomask is subsequently fabricated according to the optical proximity corrected data in the computer. Hence, when a beam of light shines on the pattern-corrected photomask, the desired pattern is formed on the semiconductor substrate.

In general, optical proximity correction includes the addition of serifs to the corners or hammerheads to end edges of the original pattern to prevent the rounding of right-angled corners and the pulling up of line-ends.

However, as the level of integration continues to increase and device dimensions continue to reduce, distances between neighboring devices shrink. In other words, tighter design rules are required. When critical dimension of the main pattern and separation between neighboring patterns are reduced to a certain extent, the addition of serifs to corners or the addition of hammerheads to ends can no longer prevent the pull-up of line-ends.

FIG. 1A is a sketch showing the addition of serifs in a conventional optical proximity correction method. As shown in FIG. 1A, a main pattern 100 (shown in dashed lines) waiting to be transferred is provided. Main pattern 100 includes a horizontal strip 100a and a vertical strip 100b (only a portion of the vertical strip is shown). Serifs are added to the corners of main pattern 100. For example, serifs 110 are added to the corners of horizontal strip 100a and vertical strip 100b.

FIG. 1B is a magnified sketch of the tip portion of the vertical strip shown in FIG. 1A. FIG. 1B illustrates conventional dimensions and positions of those serifs 110 added to the corners of main pattern 100. For example, length 111 of the corner serif 110 is about 100 to 150 nm and width 112 of the corner serif 110 is about 100 to 150 nm. Furthermore, the corner serif 110 overlaps with the corner of a main pattern by a length 113 (about 50 nm) and a width 114 (about 50 nm).

However, when the light source is deep-ultraviolet (wavelength 248 nm) and the critical dimension of a main pattern is reduced to about 0.18 $\mu$m while the distance between neighboring lines, such as the distance between horizontal strip 100a and vertical strip 100b, is smaller than 0.2 $\mu$m, addition of serifs to the corners of the main pattern can no longer prevent the pull up of line-ends. This can be observed in FIG. 1A where the solid lines represent the resulting pattern after a photo-exposure while the dashed lines represent the original main pattern 100.

In general, addition of corner serifs and hammerhead patterns to a photomask is capable of reducing edge or corner variation after a pattern transfer. However, when the critical dimension or the distance between neighboring lines has been reduced to a certain extent, addition of serifs or hammerhead patterns according to conventional dimensions and ratios can no longer avoid the undesirable pull up of line-ends effectively.

SUMMARY OF THE INVENTION

Accordingly, one object of the present invention is to provide an optical proximity correction method that uses additional corner serifs or hammerhead patterns to correct and avoid pull up of line-ends in a main pattern. Furthermore, the dimensions and ratios of these corner serifs are set such that the main pattern is corrected with only slight expansion of line-end width and line-end approaching the original design in length. A second object of this invention is to provide an optical proximity correction method suitable in the design of a photomask for fabricating metallic interconnects. The invention is able to correct the main pattern with only a slight expansion of width near its end so that the problem of an end not approaching the original design after a photo-exposure is remedied. Hence, any misalignment that may lead to uncompleted contact or an open of the metallic interconnect can be avoided. Furthermore, the slightly expanded line-end permits a higher process window in the fabrication of metallic interconnects.

To achieve these and other advantages and in accordance with the purpose of the invention, as embodied and broadly described herein, the invention provides an optical proximity correction method. First, a main pattern waiting to be transferred is provided. A first assist feature is added to various corners of the main pattern. Distance between lines in the main pattern after placing the first assist feature is checked. If distances between neighboring lines are too small, resulting in one of the first assist features touching or overlapping with a neighboring one, a second assist feature is used to replace each of the conflicting first assist features.

This invention provides an optical proximity correction method. Assist features with different dimensions are added to a main pattern that needs to be transferred. Hence, any profile variations near the edges or corners of the main pattern after pattern transfer are reduced and processing window for the main pattern is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
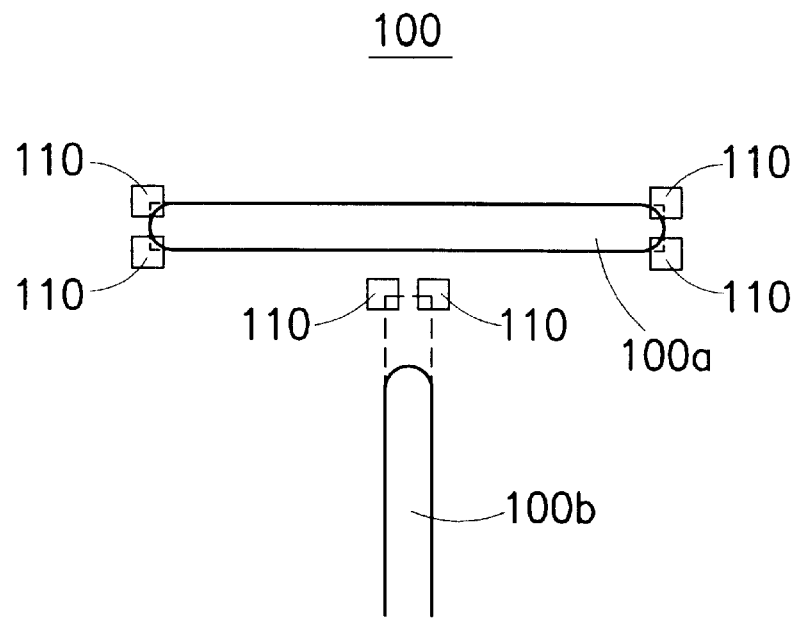
FIG. 1A is a sketch showing the addition of serifs in a conventional optical proximity correction method.
Figure 1B:
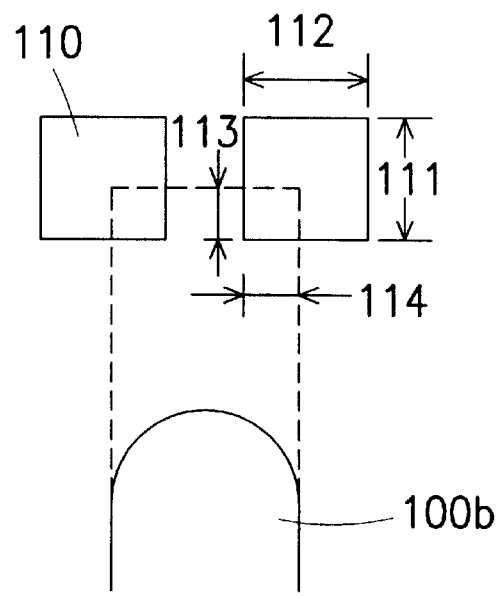
FIG. 1B is a magnified sketch of the tip portion of the vertical strip shown in FIG. 1A.

Reference will now be made in detail to the present preferred embodiments of the invention, examples of which are illustrated in the accompanying drawings. Wherever possible, the same reference numbers are used in the drawings and the description to refer to the same or like parts.

In general, equipment for carrying out a photolithographic process includes a reticle, also known as a photomask. The reticle includes a pattern that corresponds to the pattern in a particular layer of an integrated circuit. Typically, a reticle is a glass panel with a patterned non-transparent layer such as a chromium layer coated thereon. During light exposure, the reticle is placed between a light source and a silicon chip. Light from the light source penetrates the transparent glass layer and projects onto a photoresist layer on the silicon chip. Hence, the pattern on the reticle is transferred to the photoresist layer after development.

However, due to refraction and interference of light and other factors when light passes through the photomask, the transferred pattern is distorted. To produce a faithful reproduction of the original pattern and minimize distortion, an optical proximity correction method is provided in this invention. An improved method and ratio of adding corner serifs and hammerhead pattern is introduced so that metallic interconnects are fabricated with high fidelity.

Figure 2A:
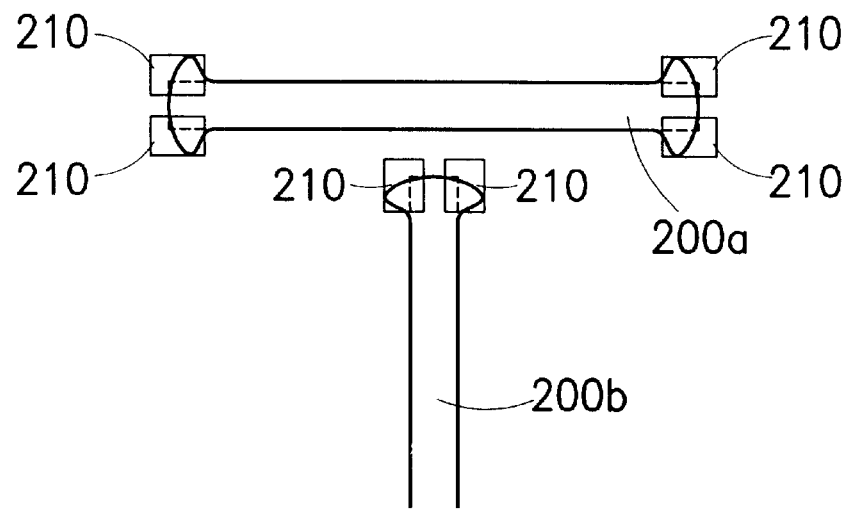
FIG. 2A is a sketch showing the addition of serifs in an optical proximity correction method according to a first preferred embodiment of this invention.

FIG. 2A is a sketch showing the addition of serifs in an optical proximity correction method according to a first preferred embodiment of this invention. As shown in FIG. 2, a layout pattern or a main pattern 200 to be transferred (shown in dashed lines) is provided. Main pattern 200 includes a horizontal strip 200a and a vertical strip 200b (only a portion is shown). Serifs are added to the corners of main pattern 200. For example, a serif 210 is added to each corner of horizontal strip 200a and vertical strip 200b. The main pattern 200 has a minimum feature width W. For example, the minimum feature width of the main pattern is 0.18 microns in a 0.15 µm manufacture process; while the minimum feature width of the main pattern is 0.16 microns in a 0.13 µm manufacture process.

Figure 2B:
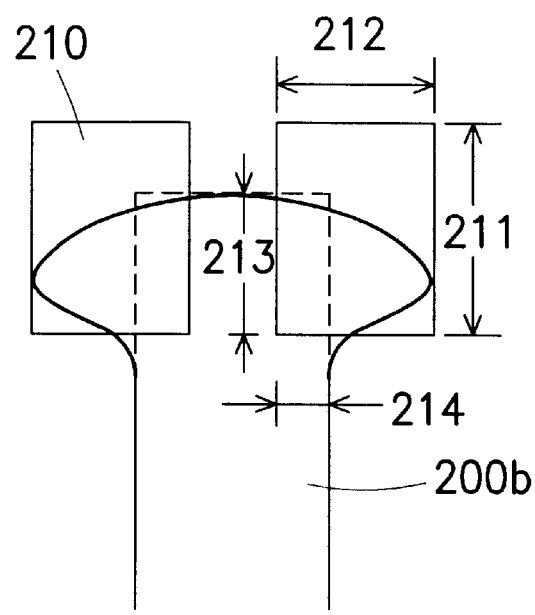
FIG. 2B is a magnified view of the tip portion of the vertical strip shown in FIG. 2A.

FIG. 2B is a magnified view of the tip portion of the vertical strip shown in FIG. 2A. As shown in FIG. 2B, with the minimum feature width W of the main pattern, a length 211 of corner serif 210 can be about 0.8W to 1.5W and a width 212 of corner serif 210 can be about 0.6W to 1.4W. The width 212 to length 211 ratio (212/211) can range between 0.5 and 1.0. A length 213 (about 0.7W to 1.2W) and a width 214 (about 0.3W to 0.7W) can overlap with each corner of main pattern 200. As a rule, length 213 is about two-third of length 211 and width 214 is about one half of width 212.

According to the method and ratio for adding corner serifs 210, critical dimension and pattern distance can be reduced to a level lower than that produced by the conventional method without causing many problems. In other words, pull up of line-ends can still be avoided even when the ratio of line width to the distance between the line and a neighboring line in a main pattern is between 0.75 and 1.5. For example, if deep ultraviolet light (having a wavelength 248 nm) is used as a light source, the critical dimension of the main pattern is about 0.18 µm. If horizontal strip 200a and vertical strip 200b are separated by a distance smaller than 0.2 µm, addition of corner serifs 210 can prevent pull up of line-ends effectively. This can be shown by the difference between the dashed lines and the solid lines in FIG. 2A. The dashed lines represent the original main pattern 200 and the solid line outlines the resulting profile after a light exposure. As shown in FIG. 2A, the line-end shown by the solid lines approaches the original main pattern design in length though with minor expansion in width near its end.

Hence, the method of this invention is suitable in the design of a photomask for fabricating metallic interconnects. The optical proximity correction method is able to correct the main pattern with only slight expansion of end width so that the end approaches the original design after a photo-exposure. Hence, any misalignment that may lead to uncompleted contact or an open of metallic interconnects can be avoided. Furthermore, the slightly expanded line-end permits a higher process window in the fabrication of metallic interconnects.

Figure 3A:
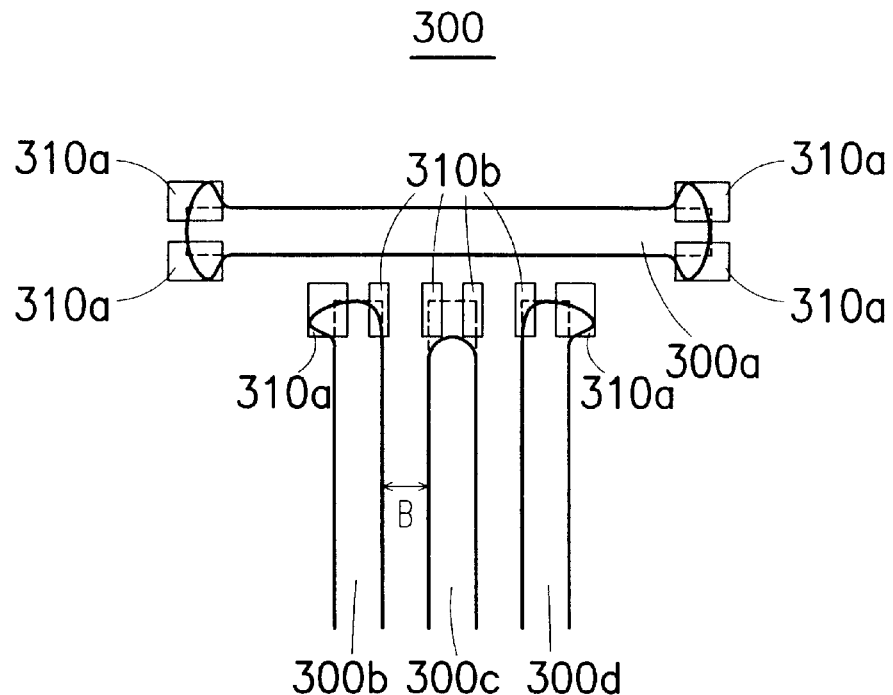
FIG. 3A is a sketch showing the addition of serifs in an optical proximity correction method according to a second preferred embodiment of this invention.

FIG. 3A is a sketch showing the addition of serifs in an optical proximity correction method according to a second preferred embodiment of this invention. As shown in FIG. 3A, a main pattern 300 (shown by dashed lines) that needs to be transferred is provided. Main pattern 300 includes a horizontal strip 300a and three closely packed vertical strips 300b, 300c and 300d (only a portion of each strip is shown). A distance B is between the vertical strips 300b and 300c. The main pattern 300 has a minimum feature width W. For example, the minimum feature width of the main pattern is 0.18 microns in a 0.15 µm manufacture process; while the minimum feature width of the main pattern is 0.16 microns in a 0.13 µm manufacture process. According to the pattern density, serifs having different dimensions are added to all corners of the main pattern 300 to prevent the overlapping of serifs in densely packed regions. For example, serifs 310a are added to four corners of horizontal strip 300a and the outer corners of vertical strips 300b and 300d, but serifs 310b are added to the inner corners of vertical strips 300b and 300d as well as the corners of vertical strip 300c. Since corner serifs 310b have a smaller width than corner serifs 310a, the addition of corner serifs 310b to the inner corners of vertical strips 300b and 300d as well as the corners of vertical strip 300c can prevent serifs from getting too close or overlapping.

Figure 3B:
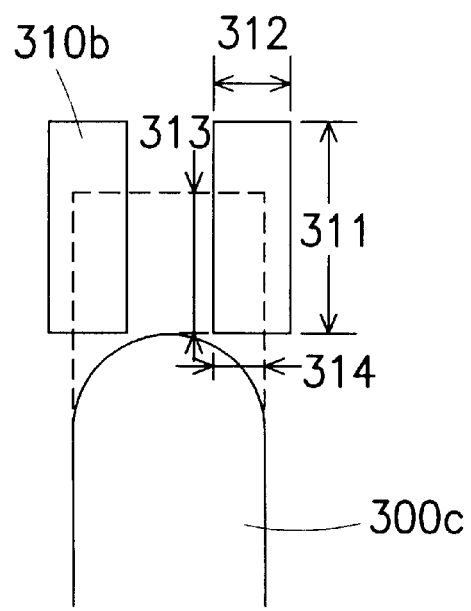
FIG. 3B is a magnified view of the tip portion of the middle vertical strips shown in FIG. 3A.

FIG. 3B is a magnified view of the tip portion of the middle vertical strips shown in FIG. 3A. As shown in FIG. 3B, with the minimum feature width W of the main pattern, length 311 of corner serif 310b can be about 0.8W to 1.5W, while width 312 of corner serif 310b should be adjusted according to the ratio of the minimum feature width W and the distance B between strips 300b, 300c, that is B is at least larger than 1.0W. Width 312 to length 311 ratio (312/311) can range between 0.2 and 0.5. A length 313 (about 0.7W to 1.2W) and a width 314 (about 0.3W to 0.7W) can overlap with the corners of main pattern 300. As a rule, length 313 is about two-third of length 311 and width 314 is about two-third of width 312. The dimensions and positions of serifs 310a on other corners of main pattern 300 are identical to corner serifs 210 in FIG. 2B.

According to the method and ratio for adding corner serifs 310a and 310b, pull up of line-ends can be avoided. This can be shown by the difference between the dashed lines and the solid lines as shown in FIG. 3A. The dashed lines mark out the original main pattern 300 and the solid lines outline the resulting profile after a light exposure. As shown in FIG. 3A, ends of horizontal strip 300a and vertical strips 300b, 300d shown by the solid line approach the original main pattern design although with minor expansion in width near its end. In addition, the shrinkage at the end of vertical strip 300c also improves.

In this invention, serifs are taken as one example for assist features added to a main pattern. However, anyone familiar with photolithographic process may know that the optical proximity correction method cited herein can also be performed with hammerhead or other similar assist features.

In summary, this invention provides an optical proximity correction method. According to the pattern density of a main pattern, different size serifs or hammerhead patterns are added to the corners of the main pattern. Hence, variation around the edges or corners of the main pattern after a pattern transfer operation is greatly minimized. When the optical proximity method is applied to the fabrication of metallic interconnects, any misalignment problems that may lead to uncompleted contact or an open of metallic interconnects can be minimized and a higher process window can be obtained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An optical proximity correction method, comprising the steps of:

providing a layout pattern with a minimum feature width, wherein the layout pattern includes a plurality of features and each feature has a plurality of corners;

placing a first assist feature over each corner of the features in the layout pattern, wherein one-fourth to one half of a width of the first assist feature overlaps with the corner and one half to three-fourths of the length of the first assist feature overlaps with the corner, such that a resulting profile after a light exposure has a broadened tip portion; and replacing each of two neighboring first assist features by a second assist feature when the neighboring first assist features touch or overlap.

2. The method of claim 1, wherein the first assist feature includes a first corner serif.

3. The method of claim 2, wherein a width-to-length ratio of the first corner serif is between about 0.5 and 1.0.

4. The method of claim 2, wherein a width of the first corner serif is between 0.6W to 1.4W, as the minimum feature width of the layout pattern is W.

5. The method of claim 2, wherein a length of the first corner serif is between 0.8W to 1.5W, as the minimum feature width of the layout pattern is W.

6. The method of claim 1, wherein the second assist feature includes a second corner serif.

7. The method of claim 6, wherein a width-to-length ratio of the second corner serif is between about 0.2 and 0.5.

8. The method of claim 6, wherein a width of the second corner serif is adjusted according to a distance between one feature to another feature, so that the distance between one feature to another feature remains larger than 1.0 W with the minimum feature width as W.

9. The method of claim 6, wherein a length of the second corner serif is between 0.8W to 1.5W, as the minimum feature width of the layout pattern is W.

10. The method of claim 6, wherein one half to three-fourths of a width of the second assist feature overlaps with the corner of the layout pattern and one half to three-fourths of a length of the second assist feature overlaps with the corner of the layout pattern.

11. The method of claim 1, wherein the first assist feature includes a plurality of first hammerhead patterns.

12. The method of claim 1, wherein the second assist feature includes a plurality of second hammerhead patterns.

* * * * *